(12) United States Patent
Chen et al.

(10) Patent No.: US 9,012,275 B2
(45) Date of Patent: Apr. 21, 2015

(54) METHOD OF FORMING THIN FILM TRANSISTOR

(71) Applicant: AU Optronics Corp., Hsin-Chu (TW)

(72) Inventors: Chung-Tao Chen, Hsin-Chu (TW);
Wu-Hsiung Lin, Hsin-Chu (TW);
Po-Hsueh Chen, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 4 days.

(21) Appl. No.: 14/094,764

(22) Filed: Dec. 2, 2013

(65) Prior Publication Data
US 2014/0080271 A1    Mar. 20, 2014

Related U.S. Application Data

(62) Division of application No. 13/284,961, filed on Oct. 30, 2011, now Pat. No. 8,674,350.

(30) Foreign Application Priority Data

Aug. 30, 2011   (TW) .............................. 100131068 A

(51) Int. Cl.
 *H01L 29/66*   (2006.01)
 *H01L 29/417*  (2006.01)
 *H01L 29/786*  (2006.01)

(52) U.S. Cl.
 CPC .... *H01L 29/66765* (2013.01); *H01L 29/41733* (2013.01); *H01L 29/78606* (2013.01); *H01L 29/7869* (2013.01)

(58) Field of Classification Search
 CPC ...................... H01L 29/66765; H01L 29/7869
 USPC ..................... 438/161; 257/E21.414, E29.151
 See application file for complete search history.

(56) References Cited

U.S. PATENT DOCUMENTS

| | | |
|---|---|---|
| 8,367,486 B2 | 2/2013 | Sakata |
| 2008/0299702 A1 | 12/2008 | Son et al. |
| 2010/0065839 A1 | 3/2010 | Yamazaki |
| 2010/0072469 A1 | 3/2010 | Yamazaki |
| 2010/0193782 A1 | 8/2010 | Sakata |

FOREIGN PATENT DOCUMENTS

| | | |
|---|---|---|
| CN | 101800249 A | 8/2010 |
| CN | 101819990 A | 9/2010 |
| CN | 101847654 A | 9/2010 |
| TW | 201044581 | 12/2010 |

*Primary Examiner* — Amar Movva
(74) *Attorney, Agent, or Firm* — Winston Hsu; Scott Margo

(57) ABSTRACT

A method of forming TFT is provided. The TFT includes a gate electrode, a gate insulating layer, a first protective pattern, a second protective pattern, a source electrode, a drain electrode, a semiconductor channel layer, and a passivation layer. The first protective pattern and the second protective pattern are disposed on the gate insulating layer above the gate electrode. The source electrode is disposed on the gate insulating layer and the first protective pattern. The drain electrode is disposed on the gate insulating layer and the second protective pattern. The semiconductor channel layer is disposed on the gate insulating layer, the source electrode, and the drain electrode. In an extending direction from the source electrode to the drain electrode, a length of the first protective pattern is shorter than that of the source electrode, and a length of the second protective pattern is shorter than that of the drain electrode.

10 Claims, 15 Drawing Sheets

METHOD OF FORMING THIN FILM TRANSISTOR

CROSS REFERENCE TO RELATED APPLICATIONS

This application is a divisional of application Ser. No. 13/284,961 filed Oct. 30, 2011, now allowed, which is incorporated by reference herein in its entirety.

BACKGROUND OF THE INVENTION

1. Field of the Invention

The present invention relates to a thin film transistor of a display panel and a method of making the same, and more particularly to a thin film transistor which can maintain the threshold voltage stability, and a method of making the above thin film transistor.

2. Description of the Prior Art

With the rapid development of display technology, there are more and more demands in the market for high resolution, low power consumption, and high performance display, so thin film transistors (TFTs) play a more important role than they did ever before. However, thin film transistors fabricated by traditional manufacturing processes often encounter reliability problems, such as poor threshold voltage stability (Vth stability). Referring to FIG. 1, FIG. 1 is a plot illustrating the relationship of the drain-to-source current (Ids) versus the gate-to-source voltage (Vgs) of the thin film transistors of a conventional LCD panel after specific deterioration conditions. As illustrated in FIG. 1, to turn off a thin film transistor normally, Ids needs to be below a threshold value (e.g. $10^{-9}$ Ampere). Several sets of different stress time are set up under specific deterioration conditions (e.g. 60° C., Vgs=−35V), and the relationship of Ids versus Vgs is measured when the drain-to-source voltage (Vds) is equal to 10V. As the stress time becomes longer (e.g. 60 seconds, 300 seconds, 600 seconds, and 1000 seconds), to let Ids be below a threshold value (e.g. $10^{-9}$ Ampere), the absolute value of Vgs has to become larger. In other words, the longer deterioration the thin film transistor goes through, the higher the absolute Vth value to overcome to turnoff the thin film transistor. I.e. it becomes less easy to turn off the thin film transistor with normal voltage, which is so-called the problem of poor threshold voltage stability.

The poor threshold voltage stability is mostly caused by the fact that between a semiconductor channel layer and a gate insulating layer there are defects or roughness on an interface in which the interface-trapped charge accumulates easily. Referring to FIG. 2, FIG. 2 is a schematic diagram illustrating a thin film transistor of a conventional LCD panel. As illustrated in FIG. 2, a thin film transistor 100 is disposed on a substrate 1 of a LCD panel. The thin film transistor 100 includes a gate electrode 2 disposed on the substrate 1, a gate insulating layer 3 disposed on the gate electrode 2 and the substrate 1, a source electrode 4 and a drain electrode 5 disposed on the gate insulating layer 3, a semiconductor channel layer 6 partially disposed on the gate insulating layer 3 between the source electrode 4 and the drain electrode 5, and partially disposed on the source electrode 4 and the drain electrode 5, and a passivation layer 7 disposed on the semiconductor channel layer 6, the source electrode 4, and the drain electrode 5. As we can see from FIG. 2, during the process of patterning a metal layer to form the source electrode 4 and the drain electrode 5, a surface of the gate insulating layer 3 will be damaged, leading to the generation of defects and roughness on the interface between the semiconductor channel layer 6 and the gate insulating layer 3, and that is the main cause of the interface-trapped charge accumulation.

SUMMARY OF THE INVENTION

It is one of the objectives of the present invention to provide a thin film transistor of a display panel and a method of making the same, to maintain the threshold voltage stability of the above thin film transistor.

To achieve the aforementioned objective, the present invention provides a thin film transistor formed on a substrate. The thin film transistor includes a gate electrode, a gate insulating layer, a first protective pattern, a second protective pattern, a source electrode, a drain electrode, a semiconductor channel layer, and a passivation layer. The gate electrode is disposed on the substrate. The gate insulating layer is disposed on the gate electrode and the substrate. The first protective pattern and the second protective pattern are disposed on the gate insulating layer above the gate electrode. The source electrode is disposed on the gate insulating layer and the first protective pattern. The drain electrode is disposed on the gate insulating layer and the second protective pattern. The semiconductor channel layer is partially disposed on the gate insulating layer between the source electrode and the drain electrode, and partially disposed on the source electrode and the drain electrode. The passivation layer is disposed on the semiconductor channel layer, the source electrode, and the drain electrode. In an extending direction from the source electrode to the drain electrode, a length of the first protective pattern is shorter than a length of the source electrode, and a length of the second protective pattern is shorter than a length of the drain electrode.

To achieve the aforementioned objective, the present invention further provides a method of forming a thin film transistor, including the following steps. First, a substrate is provided, and a gate electrode is formed on the substrate. Next, a gate insulating layer is formed on the substrate and covers the gate electrode. Then, a first protective pattern, a second protective pattern, a source electrode and a drain electrode are formed on the gate insulating layer, wherein the source electrode is formed on the first protective pattern, and the drain electrode is formed on the second protective pattern. The first protective pattern and the second protective pattern are made of a metal oxide and disposed on the gate insulating layer above the gate electrode and in physical contact with a top surface of the gate insulating layer, the first protective pattern has a first outer fringe and a first inner fringe and the second protective pattern has a second outer fringe and a second inner fringe with the first inner fringe of the first protective pattern and the second inner fringe of the second protective pattern facing each other, the source electrode covers a side of the first outer fringe of the first protective pattern, and the drain electrode covers a side of the second outer fringe of the second protective pattern. Subsequently, a semiconductor channel layer is formed on a top surface of the source electrode and a top surface of the drain electrode, and on the gate insulating layer between the source electrode and the drain electrode. Finally, a passivation layer is formed on the semiconductor channel layer, the source electrode and the drain electrode. In an extending direction from the source electrode to the drain electrode a length of the first protective pattern is shorter than a length of the source electrode and a length of the second protective pattern is shorter than a length of the drain electrode. In a direction perpendicular to the extending direction the first inner fringe of the first protective pattern is substantially aligned to an inner fringe of the source electrode and the second inner fringe of the second protective pattern is substantially aligned to an inner fringe of the drain electrode.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be detailed as follows. The preferred embodiments of the present invention are illustrated in the accompanying drawings with numbered elements to elaborate the contents and effects to be achieved.

Figure 1:
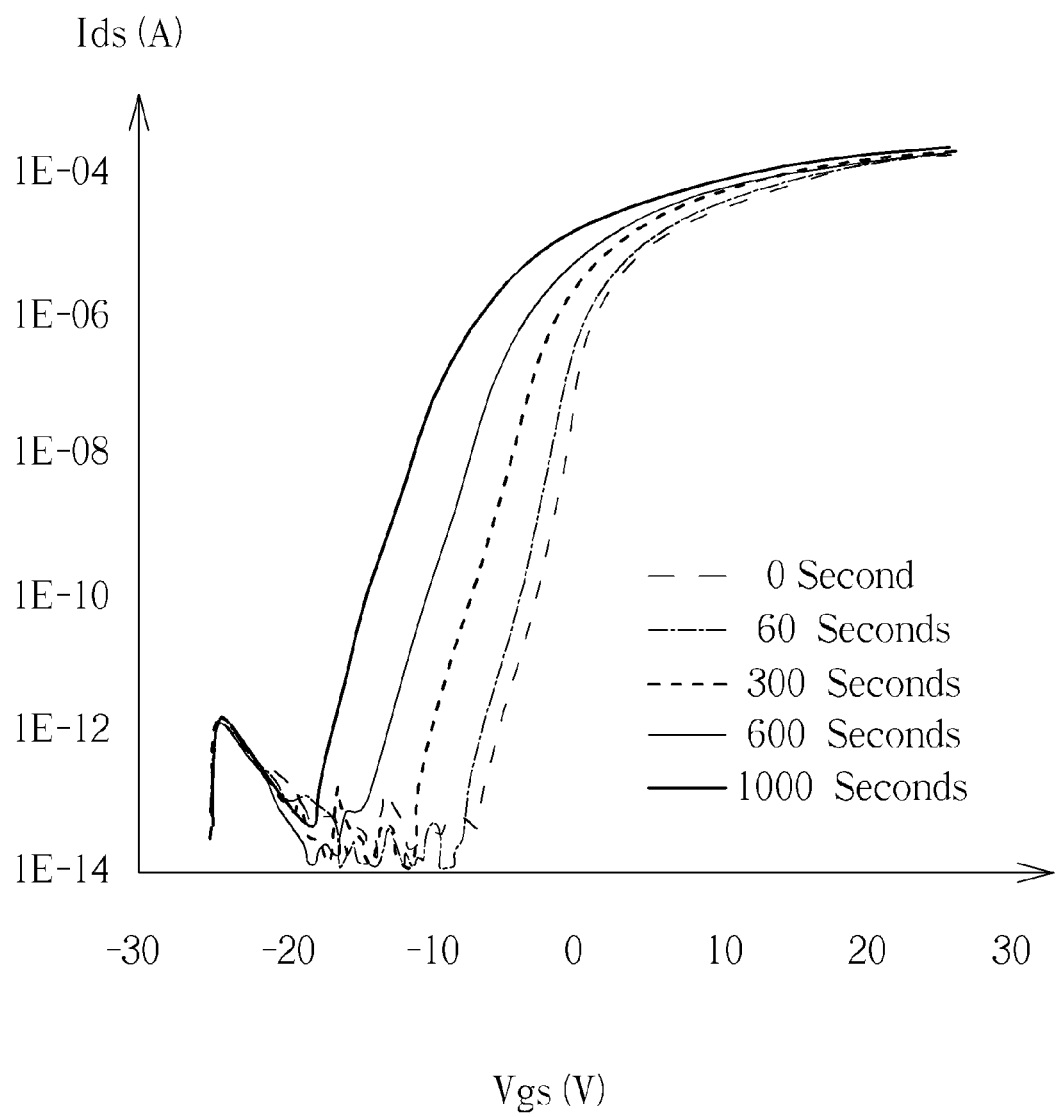
FIG. 1 is a plot illustrating the relationship of the drain-to-source current (Ids) versus the gate-to-source voltage (Vgs) of the thin film transistors of a conventional LCD panel after specific deterioration conditions.
Figure 2:
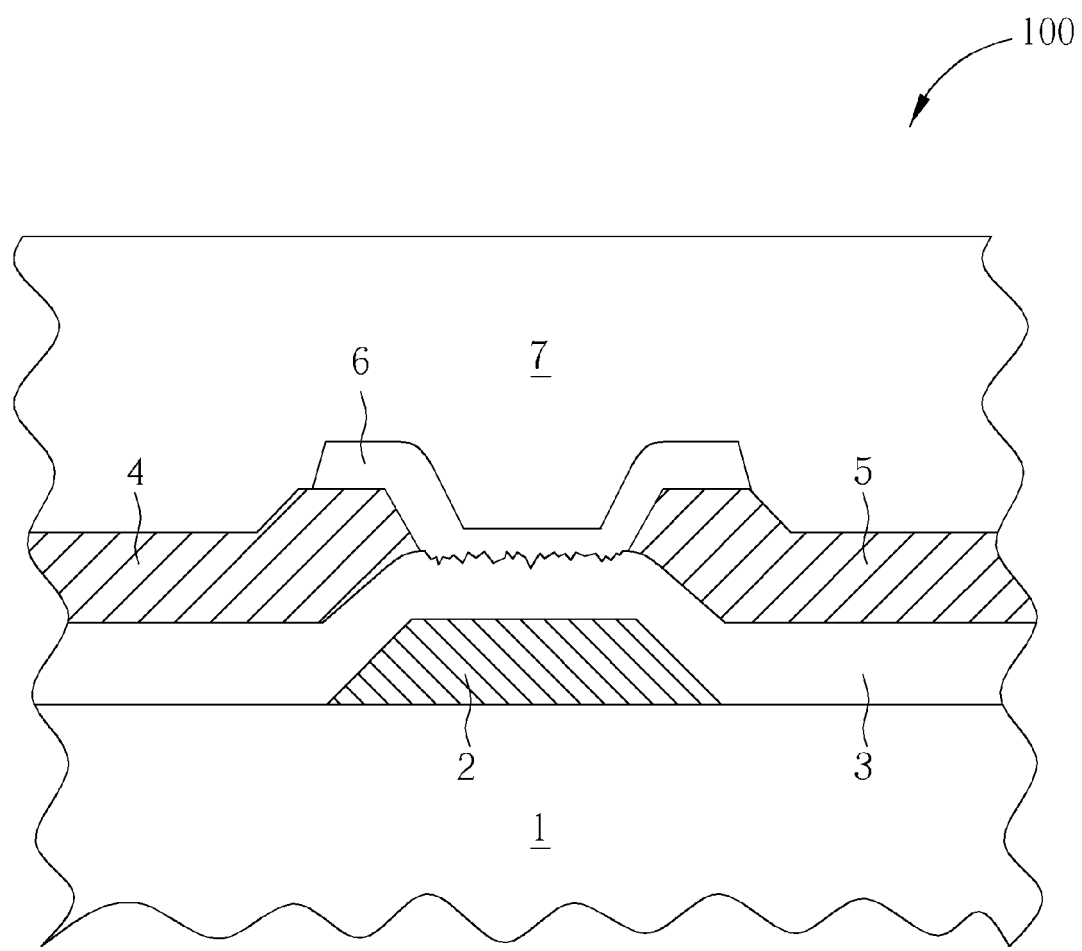
FIG. 2 is a schematic diagram illustrating a thin film transistor of a conventional LCD panel.
Figure 3:
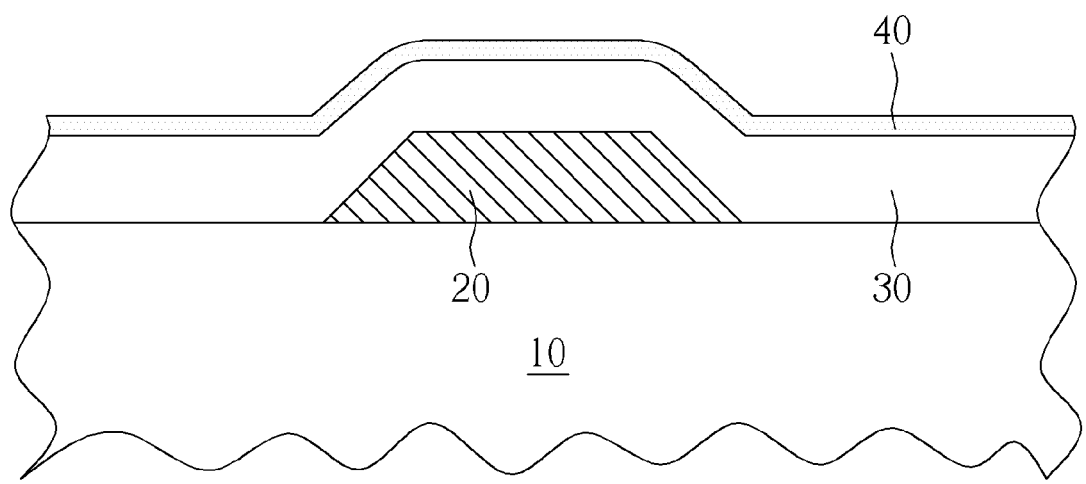
FIG. 3 to FIG. 10 are schematic diagrams illustrating a method of forming a thin film transistor according to a first preferred embodiment of the present invention.
Figure 4:
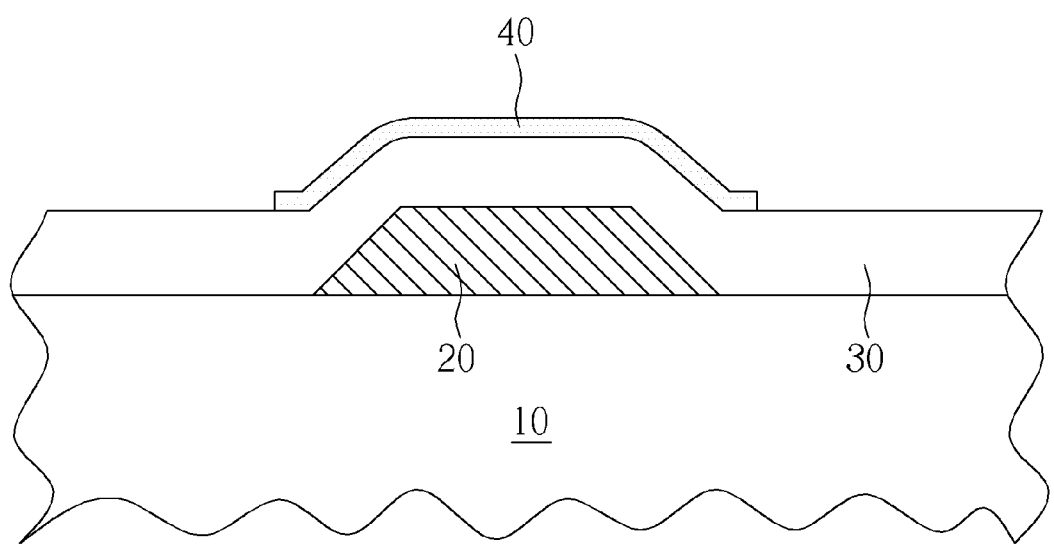

Referring to FIG. 3 to FIG. 10, FIG. 3 to FIG. 10 are schematic diagrams illustrating a method of forming a thin film transistor according to a first preferred embodiment of the present invention. As illustrated in FIG. 3, a substrate 10 is provided first, and a gate electrode 20 is formed on the substrate 10. Next, a gate insulating layer 30 is formed on the substrate 10 and covers the gate electrode 20, and a first protective layer 40 is formed on the gate insulating layer 30. In the present embodiment, the materials of the gate insulating layer 30 may include silicon nitride, silicon oxide, aluminum oxide, or yttrium oxide, and those of the first protective layer 40 may include indium-tin oxide, indium-gallium-zinc oxide, indium-zinc oxide, indium oxide, or zinc oxide, but are not limited. Then, as illustrated in FIG. 4, the first protective layer 40 is patterned, and the patterned first protective layer 40 is substantially corresponding to the gate electrode 20.

Figure 5:
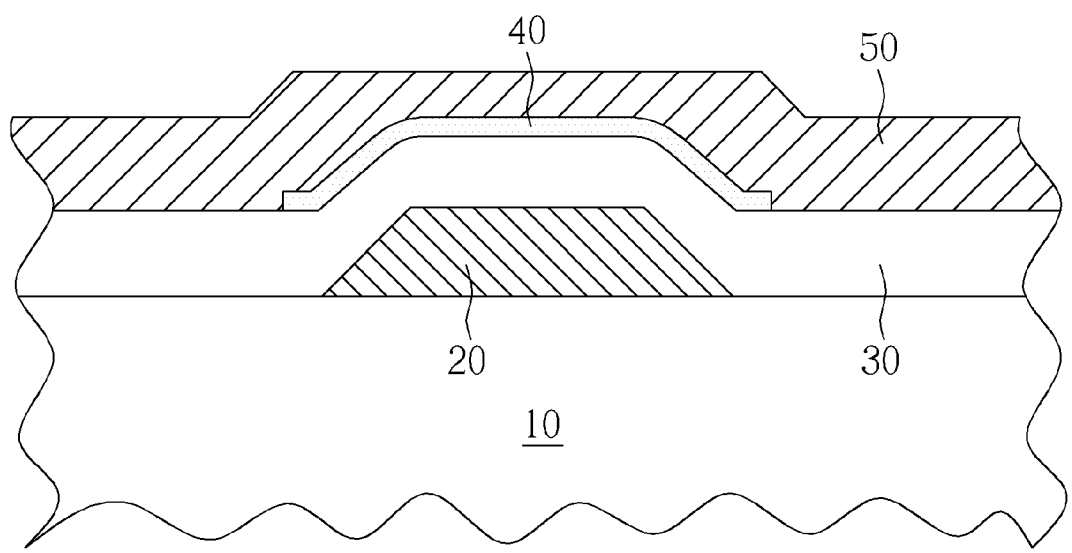
Figure 6:
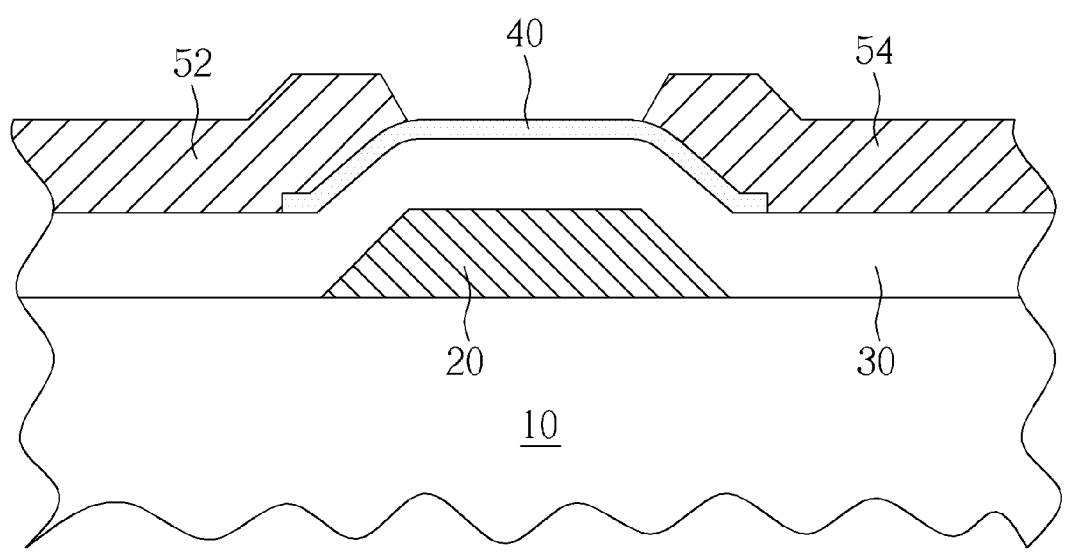

Subsequently, as illustrated in FIG. 5, a metal layer 50 is formed on the gate insulating layer 30 and the patterned first protective layer 40. The materials of the metal layer 50 may include titanium/aluminum/titanium or molybdenum, but are not limited. Then, as illustrated in FIG. 6, the metal layer 50 is patterned to form a source electrode 52 and a drain electrode 54. The step of patterning the metal layer 50 may be performed by dry etching but is not limited. For example, the metal layer 50 uncovered by a photo resist layer (not shown) is removed by the ions of fluorine or chlorine to form the source electrode 52 and the drain electrode 54. In this process, a surface of the gate insulating layer 30 between the source electrode 52 and the drain electrode 54 is covered by the patterned first protective layer 40, preventing the surface from being further damaged. Therefore, no defect or roughness is generated.

The reason why the first protective layer 40 can provide the effect of protecting the surface of the gate insulating layer 30 is mainly because the etching rate of the dry etching on the metal layer 50 is higher than that of the dry etching on the first protective layer 40. In other words, during the process of etching the metal layer 50 uncovered by the photo resist layer (not shown), the first protective layer 40 is not removed, so the surface of the gate insulating layer 30 covered by the first protective layer 40 will not be damaged.

Figure 7:
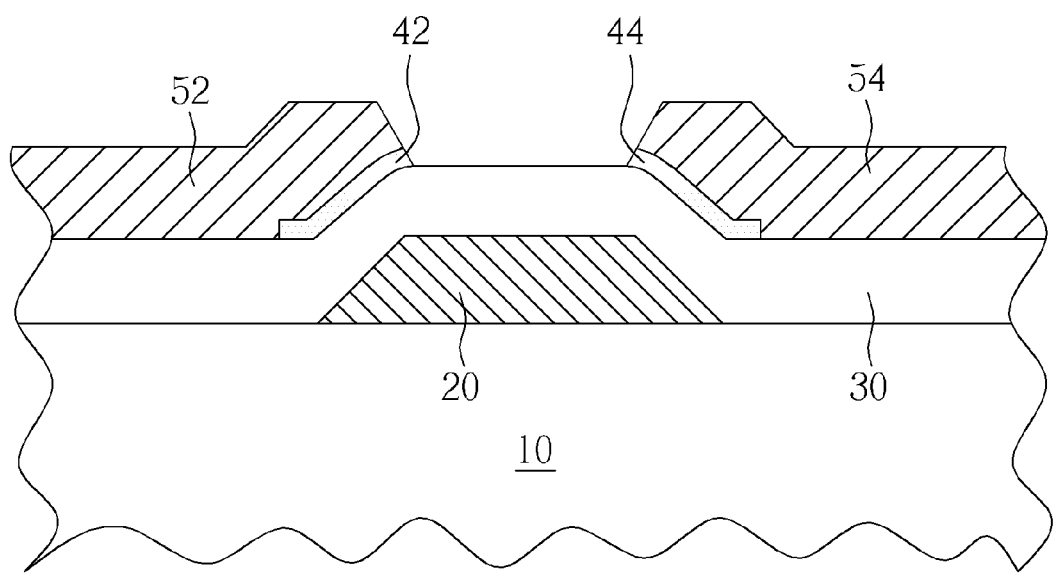

As illustrated in FIG. 7, then the patterned first protective layer 40 uncovered by the source electrode 52 and the drain electrode 54 is removed to form a first protective pattern 42 and a second protective pattern 44. This step may be performed by wet etching but is not limited. For example, the patterned first protective layer 40 uncovered by the source electrode 52 and the drain electrode 54 is removed by the oxalic acid. Since the etching rate of the wet etching on the first protective layer 40 is higher than that of the wet etching on the gate insulating layer 30, the surface of the gate insulating layer 30 will not be damaged when the patterned first protective layer 40 uncovered by the source electrode 52 and the drain electrode 54 is being removed.

Figure 8:
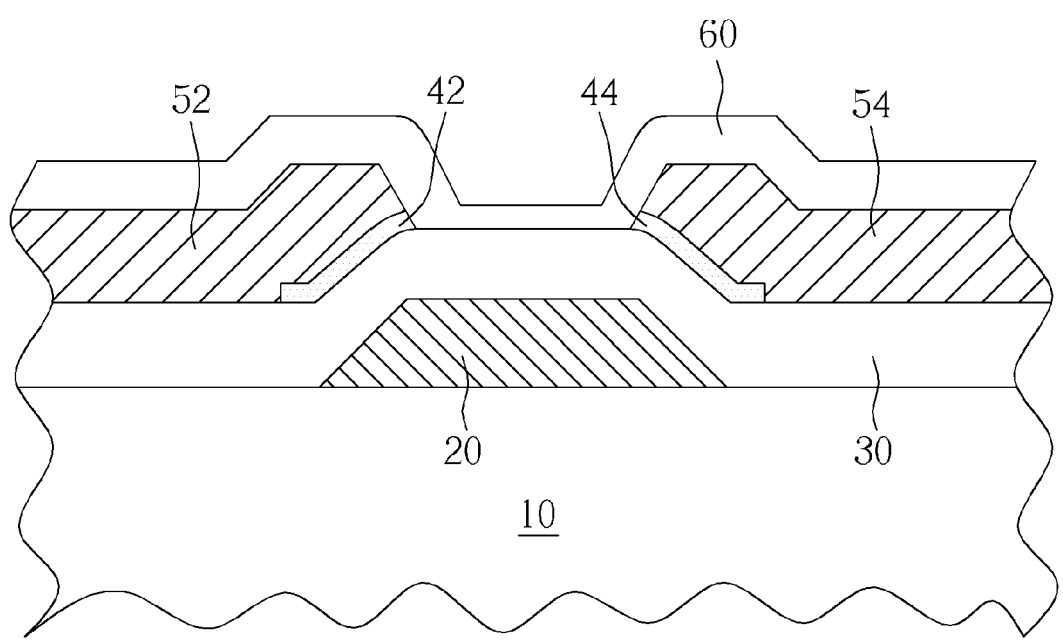
Figure 9:
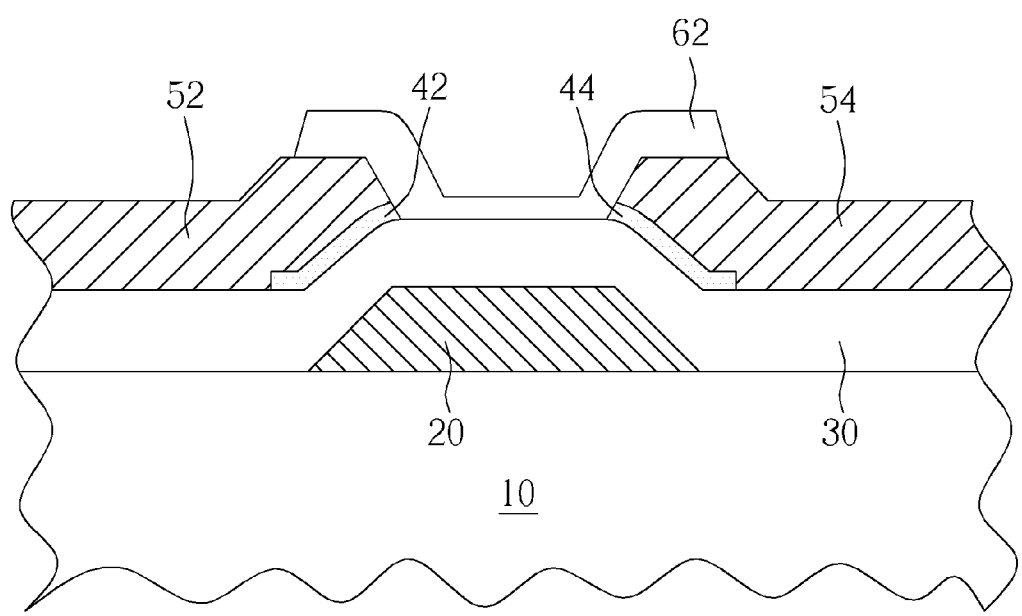

Subsequently, as illustrated in FIG. 8, a semiconductor layer 60 is formed on the source electrode 52 and the drain electrode 54, and on the gate insulating layer 30 between the source electrode 52 and the drain electrode 54. The materials of the semiconductor layer 60 may include indium-gallium-zinc oxide, indium-zinc oxide, zinc oxide, zinc-tin oxide, tin oxide, pentacene, tetracene, or α,ω-dihexylsexithiophene, but are not limited. Then, as illustrated in FIG. 9, the semiconductor layer 60 is patterned to form a semiconductor channel layer 62. Subsequently, as illustrated in FIG. 10, a passivation layer 80 is formed on the semiconductor channel layer 62, the source electrode 52 and the drain electrode 54, and the fabrication of the thin film transistor 200 of the present embodiment is accomplished.

Figure 10:
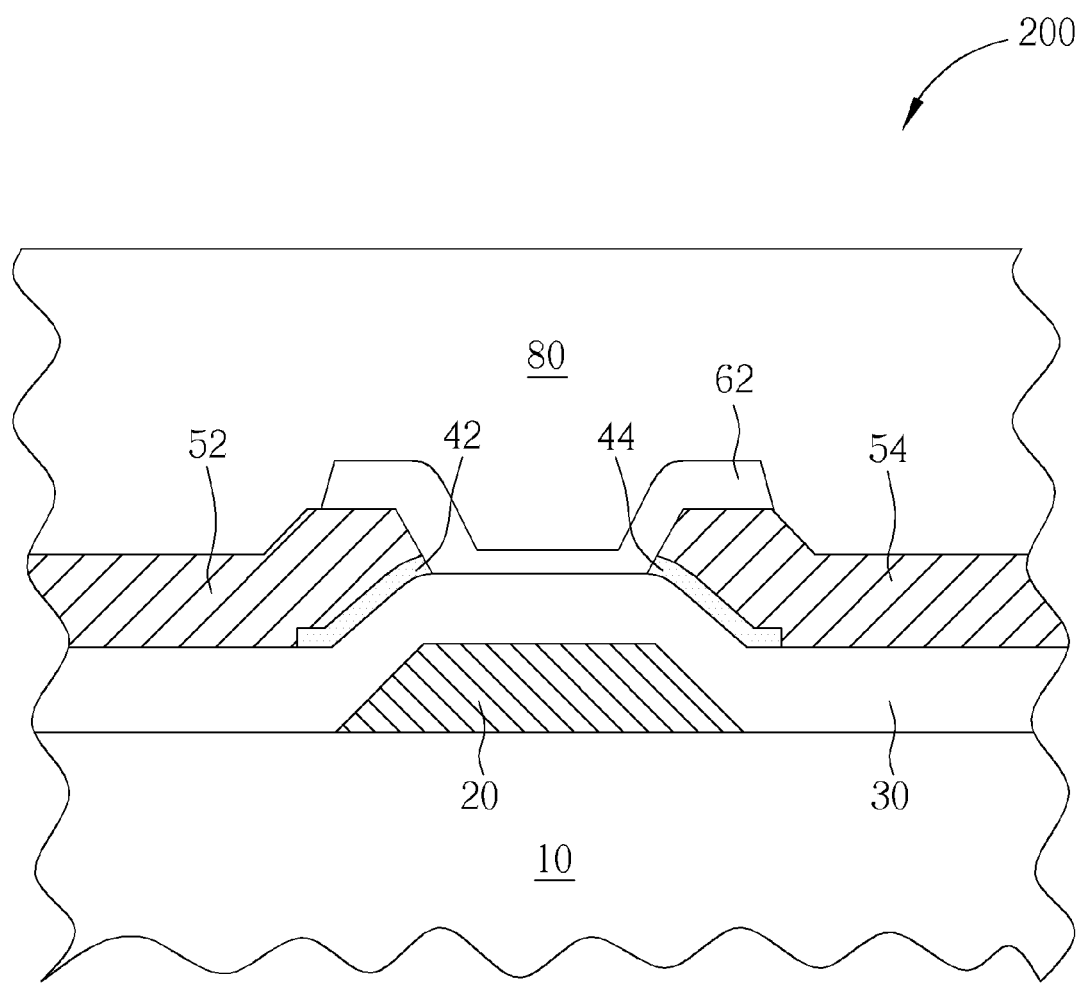
Figure 11:
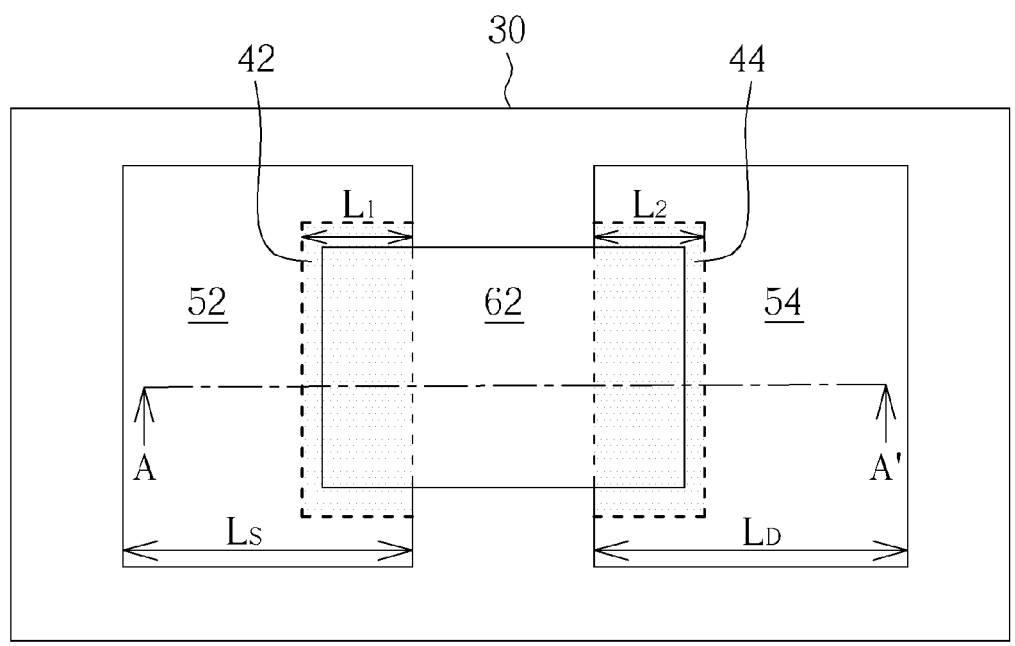
FIG. 11 is a top view illustrating a thin film transistor according to the first preferred embodiment of the present invention.

Referring to FIG. 11 along with FIG. 10, FIG. 11 is a top view illustrating a thin film transistor according to the first preferred embodiment of the present invention, while FIG. 10 is a cross-sectional view taken along a channel direction A-A' of the thin film transistor in FIG. 11. As illustrated in FIG. 11, in the channel direction A-A' of the thin film transistor 200 or in an extending direction from the source electrode 52 to the drain electrode 54, a length $L_1$ of the first protective pattern 42 is shorter than a length $L_S$ of the source electrode 52, and a length $L_2$ of the second protective pattern 44 is shorter than a length $L_D$ of the drain electrode 54. Hence, the source electrode 52 partially contacts the gate insulating layer 30 and partially contacts the first protective pattern 42, while the drain electrode 54 partially contacts the gate insulating layer 30 and partially contacts the second protective pattern 44. Because the adhesion between the source electrode 52 and the gate insulating layer 30 is stronger than that between the source electrode 52 and the first protective pattern 42, the phenomenon of metal peeling does not occur easily. Similarly, the adhesion between the drain electrode 54 and the gate insulating layer 30 is stronger than that between the drain electrode 54 and the second protective pattern 44, the phenomenon of metal peeling does not occur easily, either.

As illustrated in FIG. 10, the thin film transistor 200 according to the first preferred embodiment includes a gate electrode 20, a gate insulating layer 30, a first protective pattern 42, a second protective pattern 44, a source electrode 52, a drain electrode 54, a semiconductor channel layer 62, and a passivation layer 80. The gate electrode 20 is disposed on a substrate 10. The gate insulating layer 30 is disposed on the gate electrode 20 and the substrate 10. The first protective pattern 42 and the second protective pattern 44 are disposed on the gate insulating layer 30 above the gate electrode 20. The source electrode 52 is disposed on the gate insulating layer 30 and the first protective pattern 42. The drain electrode 54 is disposed on the gate insulating layer 30 and the second protective pattern 44. The semiconductor channel layer 62 is partially disposed on the gate insulating layer 30 between the source electrode 52 and the drain electrode 54, and partially disposed on the source electrode 52 and the drain electrode 54. The passivation layer 80 is disposed on the semiconductor channel layer 62, the source electrode 52, and the drain electrode 54. As illustrated in FIG. 11, in an extending direction from the source electrode 52 to the drain electrode 54, a length $L_1$ of the first protective pattern 42 is shorter than a length $L_S$ of the source electrode 52, and a length $L_2$ of the second protective pattern 44 is shorter than a length $L_D$ of the drain electrode 54.

From the above-mentioned description we know, in the thin film transistor 200 according to the first preferred embodiment, there is no defective or rough interface between the semiconductor channel layer 62 and the gate insulating layer 30. This is because during the process of patterning the metal layer 50 to form the source electrode 52 and the drain electrode 54, the surface of the gate insulating layer 30 between the source electrode 52 and the drain electrode 54 is covered by the patterned first protective layer 40, preventing the surface from being further damaged.

The thin film transistor of the present invention is not limited to the above-mentioned embodiment, and may have other different embodiments. To simplify the description and for the convenience of comparison between each of the embodiments of the present invention, the identical components in each of the following embodiments are marked with identical symbols. For making it easier to compare the difference between the embodiments, the following description will detail the dissimilarities among different embodiments and the identical features will not be redundantly described.

Figure 12:
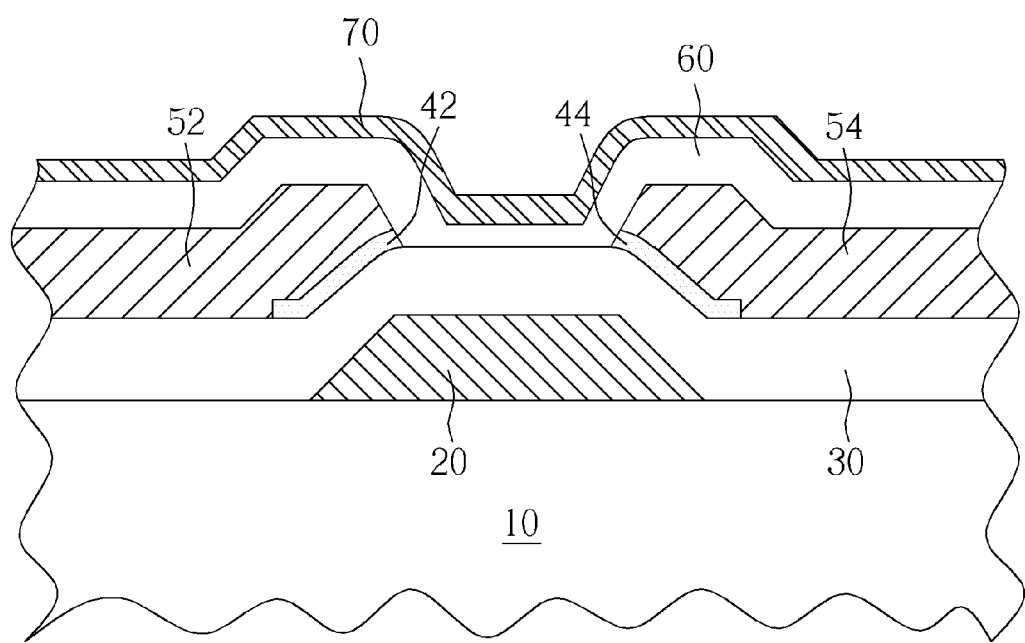
FIG. 12 to FIG. 14 are schematic diagrams illustrating a method of forming a thin film transistor according to a second preferred embodiment of the present invention.
Figure 13:
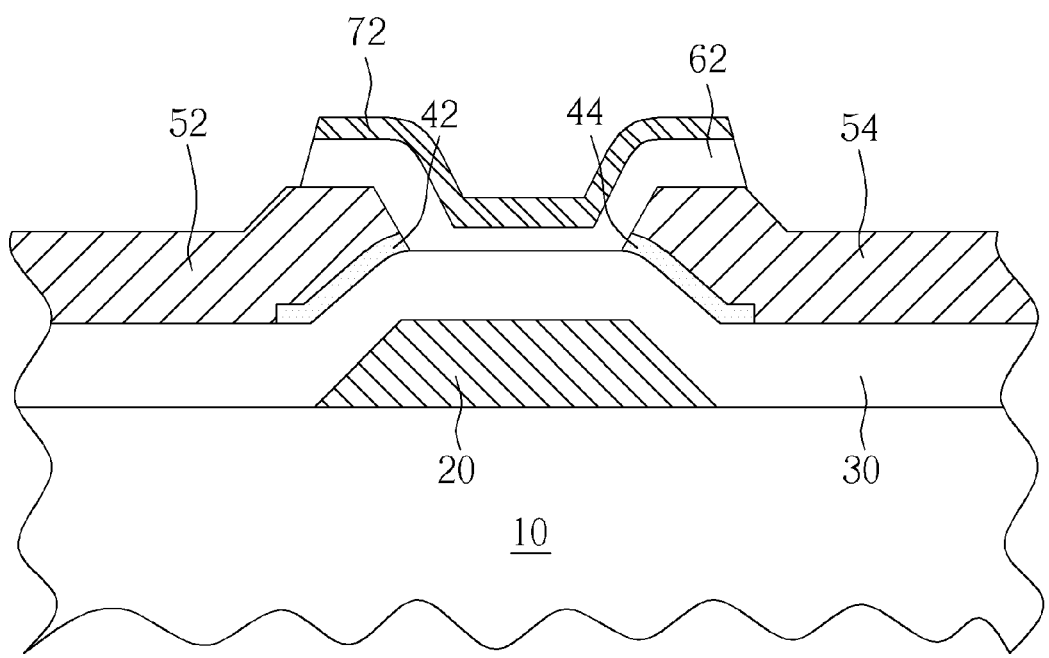
Figure 14:
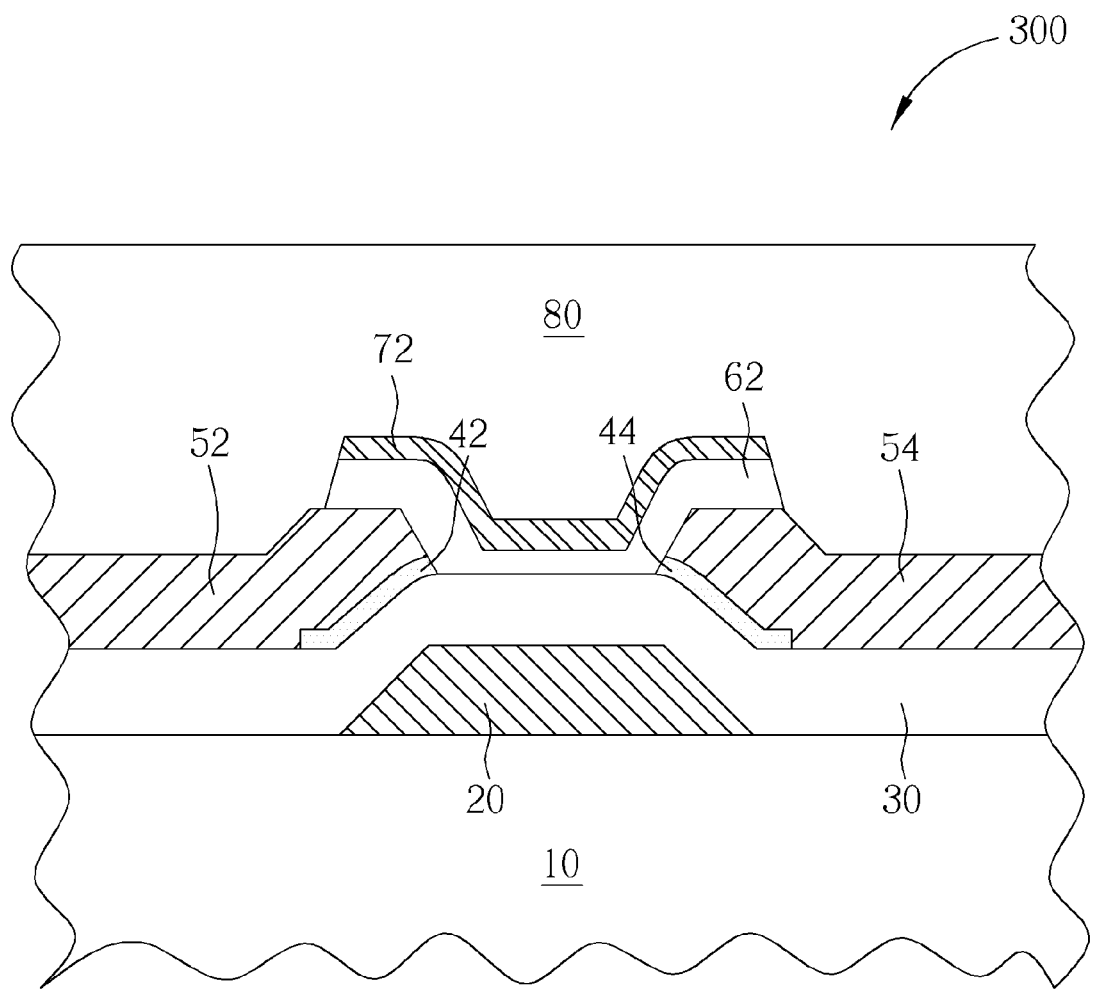

Referring to FIG. 12 to FIG. 14 along with FIG. 3 to FIG. 8, FIG. 3 to FIG. 8 and FIG. 12 to FIG. 14 are schematic diagrams illustrating a method of forming a thin film transistor according to a second preferred embodiment of the present invention. Following the above-mentioned FIG. 8, as illustrated in FIG. 12, a second protective layer 70 is formed on the semiconductor layer 60, wherein the materials of the second protective layer 70 may include silicon nitride, silicon oxide, aluminum oxide, yttrium oxide, or titanium oxide, but are not limited. As illustrated in FIG. 13, the second protective layer 70 is patterned to form a third protective pattern 72, while the semiconductor layer 60 is patterned to form a semiconductor channel layer 62. In the present embodiment, the third protective pattern 72 and the semiconductor channel layer 62 are disposed correspondingly, and can be patterned by a photolithography process. Then, as illustrated in FIG. 14, a passivation layer 80 is formed on the third protective pattern 72, the source electrode 52 and the drain electrode 54, and the fabrication of the thin film transistor 300 of the present embodiment is accomplished. The purpose of forming the third protective pattern 72 correspondingly on the semiconductor channel layer 62 before the passivation layer 80 is formed is to prevent the semiconductor channel layer 62 from contacting a photo resist layer (not shown) directly in order to maintain the electrical stability of the thin film transistor 300.

As the aforementioned thin film transistor 200 according to the first preferred embodiment, in a channel direction A-A' of the thin film transistor 300 according to the present embodiment or in an extending direction from the source electrode 52 to the drain electrode 54, a length $L_1$ of the first protective pattern 42 is shorter than a length $L_S$ of the source electrode 52, and a length $L_2$ of the second protective pattern 44 is shorter than a length $L_D$ of the drain electrode 54. In addition, the thin film transistors 200, 300 according to the first and second preferred embodiments may include several different types. For instance, a length ratio $(L_1/L_S)$ of the first protective pattern 42 to the source electrode 52 is substantially between 0.1 and 0.5. For example, a length ratio $(L_2/L_D)$ of the second protective pattern 44 to the drain electrode 54 is substantially between 0.1 and 0.5. Furthermore, in a direction perpendicular to the channel direction A-A' or perpendicular to the extending direction from the source electrode 52 to the drain electrode 54, a fringe of the first protective pattern 42 is substantially aligned to that of the source electrode 52, and a fringe of the second protective pattern 44 is substantially aligned to that of the drain electrode 54.

As illustrated in FIG. 14, the thin film transistor 300 according to the second preferred embodiment includes a gate electrode 20, agate insulating layer 30, a first protective pattern 42, a second protective pattern 44, a source electrode 52, a drain electrode 54, a semiconductor channel layer 62, a third protective pattern 72, and a passivation layer 80. The gate electrode 20 is disposed on a substrate 10. The gate insulating layer 30 is disposed on the gate electrode 20 and the substrate 10. The first protective pattern 42 and the second protective pattern 44 are disposed on the gate insulating layer 30 above the gate electrode 20. The source electrode 52 is disposed on the gate insulating layer 30 and the first protective pattern 42. The drain electrode 54 is disposed on the gate insulating layer 30 and the second protective pattern 44. The semiconductor channel layer 62 is partially disposed on the gate insulating layer 30 between the source electrode 52 and the drain electrode 54, and partially disposed on the source electrode 52 and the drain electrode 54. The third protective pattern 72 is disposed between the semiconductor channel layer 62 and the passivation layer 80, and the third protective pattern 72 and the semiconductor channel layer 62 are disposed correspondingly. The passivation layer 80 is disposed on the third protective pattern 72, the source electrode 52, and the drain electrode 54. As illustrated in FIG. 11, in an extending direction from the source electrode 52 to the drain electrode 54, a length $L_1$ of the first protective pattern 42 is shorter than a length $L_S$ of the source electrode 52, and a length $L_2$ of the second protective pattern 44 is shorter than a length $L_D$ of the drain electrode 54.

Figure 15:
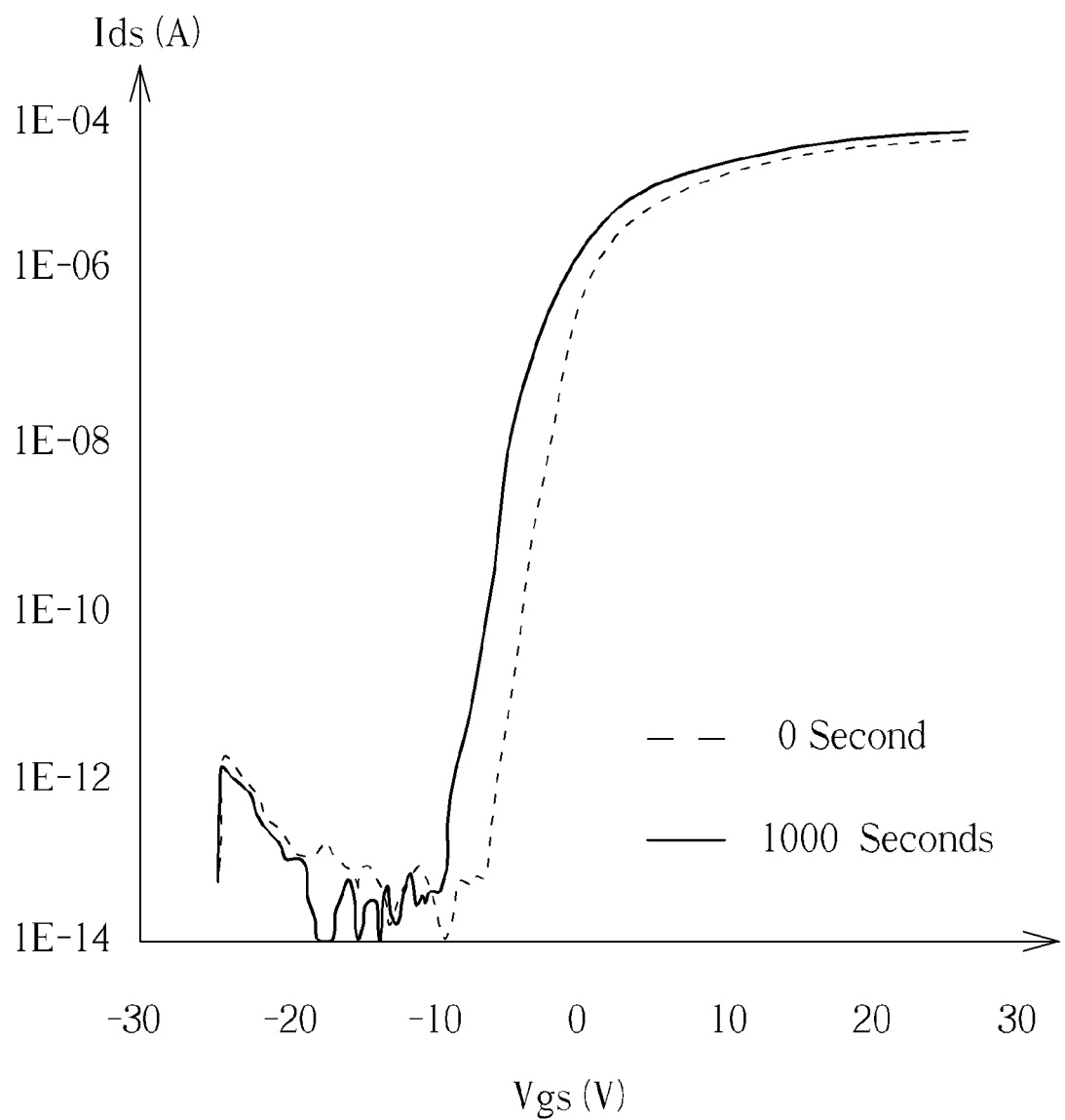
FIG. 15 is a plot illustrating the relationship of the drain-to-source current (Ids) versus the gate-to-source voltage (Vgs) of the thin film transistors according to the first and second preferred embodiments of the present invention after specific deterioration conditions.

From the above-mentioned description we know, in the thin film transistors 200, 300 according to the first and second preferred embodiments, there is no defective or rough interface between the semiconductor channel layer 62 and the gate insulating layer 30, so the interface-trapped charge does not accumulate easily and the thin film transistors 200, 300 can maintain the threshold voltage stability. This is because during the process of patterning the metal layer 50 to form the source electrode 52 and the drain electrode 54, the surface of the gate insulating layer 30 between the source electrode 52 and the drain electrode 54 is covered by the patterned first protective layer 40, preventing the surface from being further damaged, so the thin film transistors 200, 300 can maintain the threshold voltage stability. Referring to FIG. 15, FIG. 15 is a plot illustrating the relationship of the drain-to-source current (Ids) versus the gate-to-source voltage (Vgs) of the thin film transistors according to the first and second preferred embodiments of the present invention after specific deterioration conditions. As illustrated in FIG. 15, to turn off the thin film transistors 200, 300 normally, Ids needs to be below a threshold value (e.g. $10^{-9}$ Ampere). 1000 seconds stress time is set up under specific deterioration conditions (e.g. 60° C., Vgs=−35V), and the relationship of Ids versus Vgs is measured when the drain-to-source voltage (Vds) is equal to 10V. Comparing the condition of 1000 seconds stress time with the condition of no stress time, to let Ids be below a threshold value (e.g. $10^{-9}$ Ampere), the absolute value of Vgs makes no big difference. In other words, even the thin film transistors 200, 300 go through long deterioration, the absolute Vth value to overcome to turn off them only increases slightly, so the threshold voltage stability will be maintained.

In summary, the thin film transistor of the present invention makes use of a protective layer to cover the surface of the gate insulating layer between the source electrode and the drain electrode, preventing the surface from being damaged during the process of patterning a metal layer to form the source electrode and the drain electrode, so there will be no defective or rough interface between the semiconductor channel layer and the gate insulating layer. Consequently, the interface-trapped charge does not accumulate easily and the threshold voltage stability can be maintained for the thin film transistor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a thin film transistor, comprising:
   providing a substrate;
   forming a gate electrode on the substrate;
   forming a gate insulating layer on the gate electrode and the substrate;
   forming a first protective pattern, a second protective pattern, a source electrode and a drain electrode on the gate insulating layer, wherein the source electrode is formed on the first protective pattern, the drain electrode is formed on the second protective pattern, the first protective pattern and the second protective pattern are made of a metal oxide and disposed on the gate insulating layer above the gate electrode and in physical contact with a top surface of the gate insulating layer, the first protective pattern has a first outer fringe and a first inner fringe and the second protective pattern has a second outer fringe and a second inner fringe with the first inner fringe of the first protective pattern and the second inner fringe of the second protective pattern facing each other, the source electrode covers a side of the first outer fringe of the first protective pattern and the drain electrode covers a side of the second outer fringe of the second protective pattern;
   forming a semiconductor channel layer on a top surface of the source electrode and a top surface of the drain electrode, and on the gate insulating layer between the source electrode and the drain electrode;
   forming a passivation layer on the semiconductor channel layer, the source electrode and the drain electrode;
   wherein in an extending direction from the source electrode to the drain electrode a length of the first protective pattern is shorter than that of the source electrode and a length of the second protective pattern is shorter than that of the drain electrode; and
   wherein in a direction perpendicular to the extending direction the first inner fringe of the first protective pattern is substantially aligned to an inner fringe of the source electrode and the second inner fringe of the second protective pattern is substantially aligned to an inner fringe of the drain electrode.

2. The method of claim 1, wherein the step of forming the first protective pattern, the second protective pattern, the source electrode and the drain electrode comprises:
   forming a first protective layer on the gate insulating layer;
   patterning the first protective layer;
   forming a metal layer on the gate insulating layer and the patterned first protective layer;
   patterning the metal layer to form the source electrode and the drain electrode; and
   removing the patterned first protective layer uncovered by the source electrode and the drain electrode to form the first protective pattern and the second protective pattern.

3. The method of claim 2, wherein the step of patterning the metal layer is performed by dry etching.

4. The method of claim 2, wherein the step of removing the patterned first protective layer uncovered by the source electrode and the drain electrode is performed by wet etching.

5. The method of claim 1, wherein a length ratio of the first protective pattern to the source electrode is substantially between 0.1 and 0.5.

6. The method of claim 1, wherein a length ratio of the second protective pattern to the drain electrode is substantially between 0.1 and 0.5.

7. The method of claim 1, wherein materials of the first protective pattern and the second protective pattern comprise indium-tin oxide, indium-gallium-zinc oxide, indium-zinc oxide, indium oxide, or zinc oxide.

8. The method of claim 1, further comprising forming a third protective pattern on the semiconductor channel layer before the passivation layer is formed, wherein the third protective pattern and the semiconductor channel layer are disposed correspondingly.

9. The method of claim 8, wherein the third protective pattern and the semiconductor channel layer are patterned by a photolithography process.

10. The method of claim 8, wherein materials of the third protective pattern comprise silicon nitride, silicon oxide, aluminum oxide, yttrium oxide, or titanium oxide.

* * * * *